(12) United States Patent
Yoshida

(10) Patent No.: US 6,559,694 B1
(45) Date of Patent: May 6, 2003

(54) TIMING SIGNAL OCCURRENCE CIRCUIT

(75) Inventor: Takeshi Yoshida, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/636,511

(22) Filed: Aug. 10, 2000

(30) Foreign Application Priority Data

Aug. 11, 1999 (JP) .............................. 11-227578

(51) Int. Cl.[7] .................................................. H03L 7/00
(52) U.S. Cl. ........................................ 327/141; 327/149
(58) Field of Search ................................ 327/141, 144, 327/146, 149, 150, 261, 276, 284, 285, 297, 298, 299

(56) References Cited

U.S. PATENT DOCUMENTS

| | | | | |
|---|---|---|---|---|
| 4,501,002 A | * | 2/1985 | Auchterlonie | 329/309 |
| 5,424,996 A | * | 6/1995 | Martin et al. | 365/189.01 |
| 5,517,462 A | * | 5/1996 | Iwamoto et al. | 365/203 |
| 5,808,961 A | * | 9/1998 | Sawada | 365/233 |
| 5,923,676 A | * | 7/1999 | Sunter et al. | 714/733 |

* cited by examiner

Primary Examiner—Matthew Smith
Assistant Examiner—Paul Dinh
(74) Attorney, Agent, or Firm—Oblon, Spivak, McClelland, Maier & Neustadt, P.C.

(57) ABSTRACT

Object of the present invention is to provide a timing signal occurrence circuit capable of precisely adjusting timing, without complicating a circuit.

A timing signal occurrence circuit according to the present invention has a tristate buffer connected to a delay clock line, a tristate buffer connected to an operand bus, a calculator connected to an input terminal of each of the tristate buffers, a pulse generating circuit for generating an one shot pulse based on a delay clock on the delay clock line, and a calculator for fetching operands on the operand bus and carrying out calculation using the fetched operands. Either of a plurality of tristate buffers is arbitrarily selected to adjust delay time of the delay clock. Because of this, it is possible to generate a one shot pulse with optimum timing for carrying out calculation by the calculator.

8 Claims, 6 Drawing Sheets

TIMING SIGNAL OCCURRENCE CIRCUIT

CROSS REFERENCE TO RELATED APPLICATIONS

The subject application is related to subject matter disclosed in Japanese Patent Application No. H11-227578 filed on Aug. 11, 1999 in Japan to which the subject application claims priority under Paris Convention and which is incorporated herein by reference.

BACKGROUND OF THE INVENTION

1. Field of the Invention

The present invention relates to a timing signal occurrence circuit for adjusting delay of a timing signal, and targets, for example, delay adjustment of the timing signal in a semiconductor integrated circuit.

2. Related Background Art

A semiconductor circuit generally performs various processes by synchronizing each signal inputted with a clock. Therefore, there is no particular problem when using only a static circuit. However, when using a precharge circuit in order to improve speed, timings of the precharge period and the following evaluation period are out of synch. Because of this, an inherent timing signal for timing adjustment is necessary.

As one of timing signal occurrence circuits for generating such a timing signal, as shown in FIG. 1, a circuit for adjusting delay by using an inverter chain 51 is known. As shown in the timing diagram of FIG. 2, a circuit of FIG. 1 adjusts delay time by changing over the number of connection stages of the inverters.

Furthermore, as an example of the other timing signal occurrence circuit, when a circuit A needs timing when output of the other circuit B is settled, there may be provided with a dummy circuit which has the same delay time as a critical pass of the circuit A and generates the timing signal.

In case of providing the above-mentioned timing signal occurrence circuit in a semiconductor chip, a circuit is formed in combination with transistors. However, the higher a voltage applied to a transistor logic circuit constituted by combining with transistors is, and the lower the temperature is, the more quickly its circuit acts. When adjusting delay time by changing over the number of stages of the above-mentioned inverter chain 51, the delay time changes by voltage property and temperature property of the transistors.

Furthermore, when the dummy circuit is consisted of the inverter chain 51 or logic gate chain, a subject circuit (delay subject circuit) that the dummy circuit imitates is constituted alike by using the transistors, voltage property and temperature property of the transistors is cancelled to each other. Because of this, there is no particular problem.

On the other hand, when delay cause of the delay subject circuit is mainly a wiring delay (RC delay), the delay time due to the wiring delay does not change less than that due to the transistors, even if voltage or temperature changes. Because of this, a difference between the delay amounts of the dummy circuit and that of the delay subject circuit occurs. Accordingly, even if adjusting the number of connection stages of the inverters in the dummy circuit as the delay coincides with a certain condition, when voltage or temperature changes, according to circumstances, the delay time of the dummy circuit becomes shorter than the delay time of the delay subject circuit, and what is called as "racing" of the signal occurs.

The racing of the signal may also occur in accordance with process condition in case of forming the transistor, besides voltage and temperature. Because of this, when generating the timing signal by the inverter chain 51, if delay cause of the delay subject circuit is mainly wiring delay, it is necessary to take much margin for timing.

On the other hand, when generating the dummy circuit based on the critical path of the delay subject circuit and using output of the dummy circuit as the timing signal, the delay subject circuit delays at the same tendency as the dummy circuit. Because of this, there is high likelihood that its dummy circuit acts more stably than the dummy circuit is formed by using the inverter chain 51. However, because the dummy circuit imitates the critical path as it is, it is difficult to intentionally adjust the delay.

FIG. 3 is a block diagram of the timing signal occurrence circuit for adjusting timing between the timing that the operands are available on an operand bus and the timing that the calculator should start calculation. The circuit of FIG. 3 has a plurality of tristate buffers 1a, 1b and 1c connected to a delay clock line L1, a plurality of tristate buffers 2a, 2b and 2c connected to the operand bus L2, a plurality of calculators 3a, 3b and 3c connected to the input terminal of each of the tristate buffers 2a, 2b and 2c, and a calculator 3d for fetching the operands on the operand bus L2 and performing calculation by using the operands.

Among a plurality of tristate buffers 1a, 1b and 1c connected to the delay clock line L1, the left end tristate buffers 1a outputs a clock signal, and outputs of the other tristate buffers 1b and 1c is always high impedance state. That is, the tristate buffers beside the left end one is a dummy circuit to give a dummy load.

In case of a circuit of FIG. 3, the number of stages of the tristate buffers of the delay clock line L1 is set in accordance with the delay time of the critical path of the delay subject circuit. Because of this, it is difficult to intentionally adjust the delay time of the delay clock.

Furthermore, in case of the timing signal occurrence circuit for controlling the operational timing of a sense amplifier in a memory, the memory is provided with the sense amplifiers in accordance with the number of data bits. Because of this, the output of the timing signal occurrence circuit has to be distributed to each of the sense amplifiers via the buffer. Because of this, the signal delays for period necessary to path the buffers.

SUMMARY OF THE INVENTION

An object of the present invention is to provide a timing signal occurrence circuit capable of precisely adjusting timing without complicating a circuit.

In order to achieve the foregoing object, a timing signal occurrence circuit, comprising:
  a plurality of signal output circuits configured to output a timing signal, and
  a selecting circuit configured to select either one of the signal output circuits,
  wherein output terminals of all of the signal output circuits are connected to a common timing signal line, and
  wherein output terminals of the signal output circuits unselected by the selecting circuit.

Furthermore, a timing signal selecting circuit, comprising:
  a plurality of memory cells connected to word lines and bit lines;

a plurality of dummy circuits connected to the word line an the bit line different from each other, and a sense amplifier configured to amplify data read out from the selected memory cell, wherein driving timing of the sense amplifier is controlled based on signal propagation time of each of the dummy circuits.

A simplest example of the timing signal selecting circuit is a circuit that fixes an enable input terminal of each output circuit of the timing signal to low level or high level. Or the timing signal selecting circuit is a register of holding the select value, output of which is connected to an enable input terminal of each timing output circuit.

According to the present invention, delay of the timing signal is adjusted by selecting either of a plurality of signal output circuits connected to a timing signal line. Because of this, it is possible to adjust timing easily and precisely.

Especially, by using the dummy circuit provided conventionally to provide a dummy load as a signal output circuit, it is possible to perform fine adjustment without adding new components, thereby curbing cost increase.

Furthermore, according to the present invention, because the signal output circuit is selected based on a critical path of a subject circuit, it is possible to adjust the delay of the timing signal so that the subject circuit acts normally.

Furthermore, according to the present invention, because the delay of the timing signal is adjusted so that the calculator fetches the operands after the operand on the operand bus has settled, it is possible to settle operation of the calculator.

Furthermore, according to the present invention, because it is possible to adjust the delay of the timing signal only by adjusting a control terminal of the tristate buffer, circuit configuration is simplified.

Furthermore, according to the present invention, because a selecting control circuit controls the select circuit, it is possible to programmably change over the delay adjustment of the timing signal.

Furthermore, according to the present invention, because operational timing of the sense amplifier is controlled by a plurality of dummy circuits provided in the memory array, it is possible to drive the sense amplifier at optimum timing.

DESCRIPTION OF THE PREFERRED EMBODIMENTS

Hereinafter, a timing signal occurrence circuit according to the present invention will be specifically described with reference to drawings.

(First Embodiment)

Figure 1:
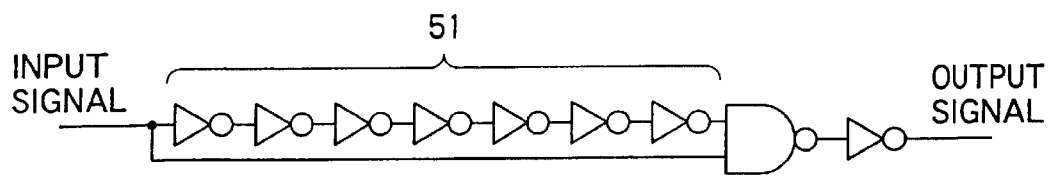
FIG. 1 is a diagram showing schematic configuration of a conventional timing signal occurrence circuit.
Figure 2:
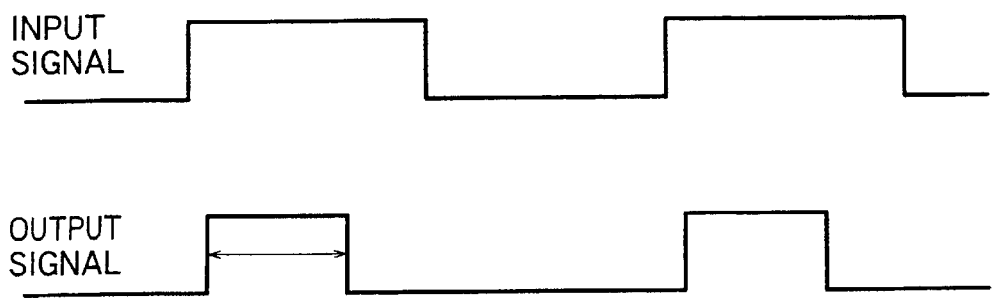
FIG. 2 is a timing chart of FIG. 1.
Figure 3:
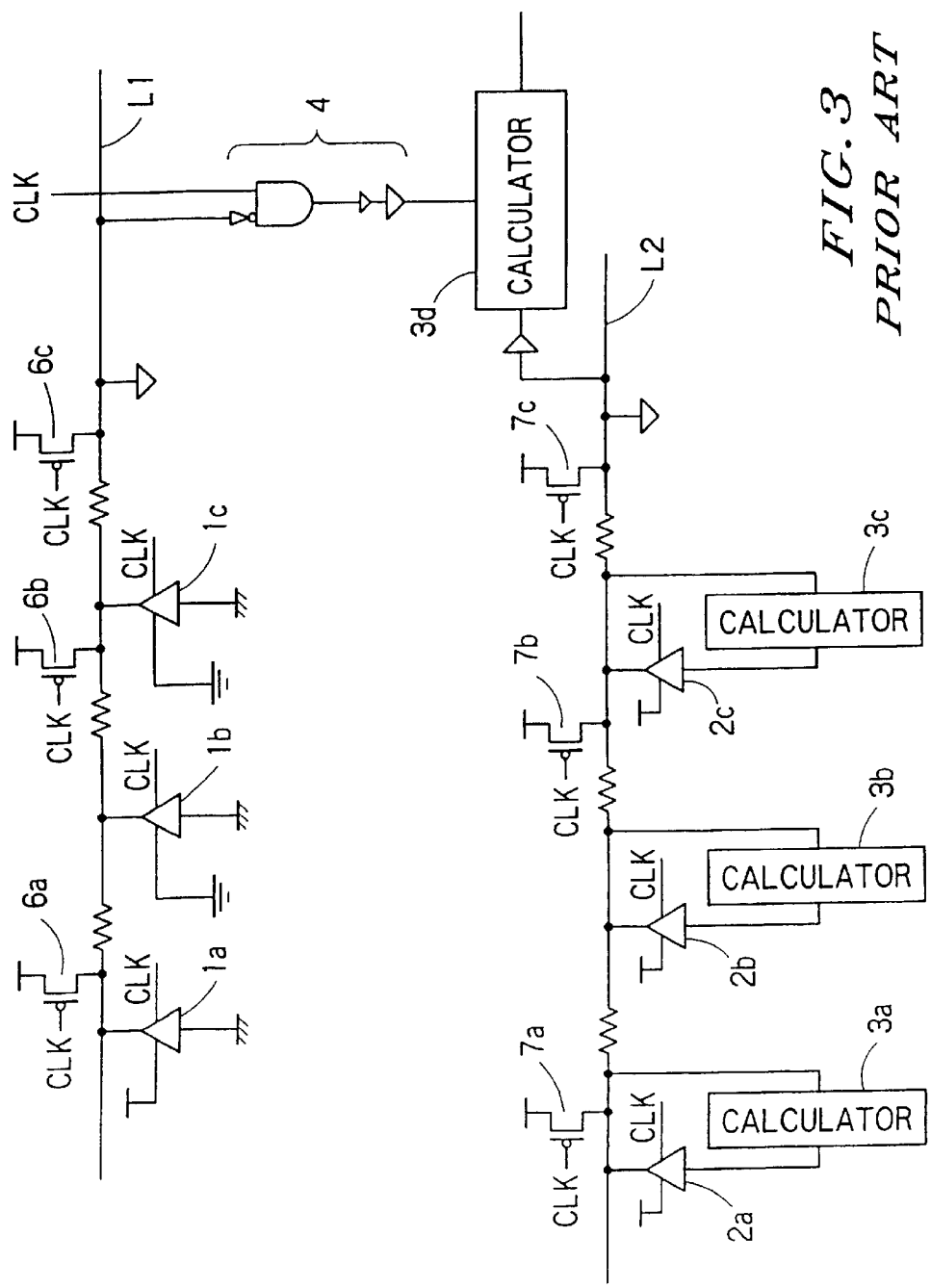
FIG. 3 is a block diagram of a timing signal occurrence circuit for adjusting timing between operands on an operand bus and a delay clock.
Figure 4:
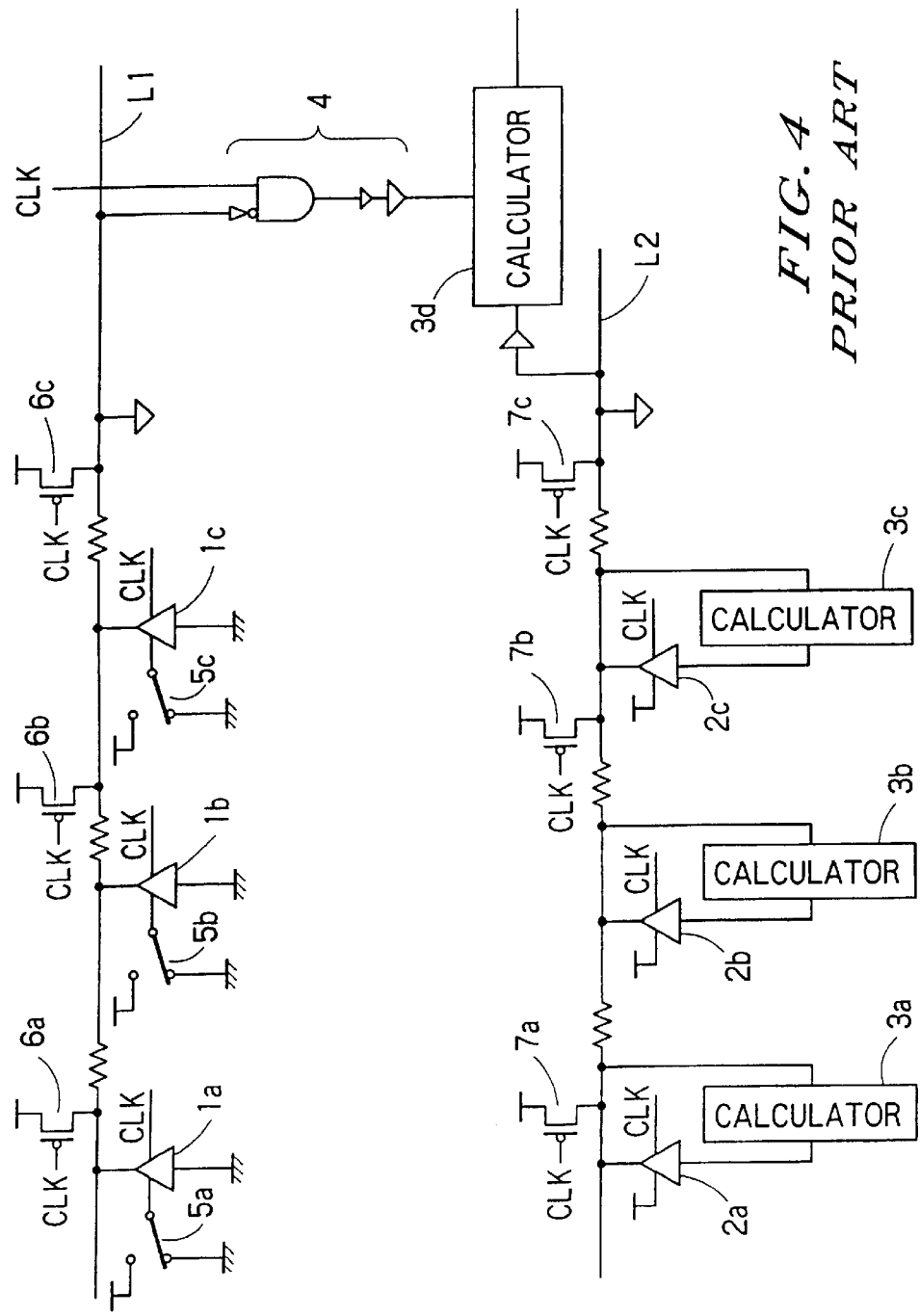
FIG. 4 is a block diagram showing schematic configuration of a first embodiment of a timing signal occurrence circuit according to the present invention.

FIG. 4 is a block diagram showing schematic configuration of a first embodiment of a timing signal occurrence circuit according to the present invention.

The timing signal occurrence circuit of FIG. 4 has a plurality of tristate buffers $1a$, $1b$ and $1c$ connected to a delay clock line L1, a plurality of tristate buffers $2a$, $2b$ and $2c$ connected to an operand bus L2, a plurality of calculators s $3a$, $3b$ and $3c$ connected to input terminals of tristate buffers $2a$, $2b$ and $2c$, respectively, a pulse generating circuit 4 for generating a one shot pulse based on a delay clock on the delay clock line L1, and a calculator $3d$ for fetching the operands on the operand bus L2 in order to perform calculation using the fetched operands.

The calculator $3d$ performs precharge operation when the one shot pulse is in high level, and carries out the calculation in case of low level.

Switches $5a$, $5b$ and $5c$ are connected to a control terminal of each of the tristate buffers $1a$, $1b$, and $1c$ connected to the delay clock line L1. When either of the switches $5a$, $5b$ and $5c$ is connected to a power supply terminal, the corresponding tristate buffer outputs a clock signal. When either of the switches $5a$, $5b$ and $5c$ is connected to a ground terminal, output of the corresponding tristate buffer becomes high impedance status.

Practically, only either one of the switches $5a$, $5b$ and $5c$ is connected to the power supply voltage terminal, and the other switches are connected to the ground terminal. The delay time of the delay clock is adjusted by change-over of these switches $5a$, $5b$ and $5c$. The delay time in this case is determined a wiring resistor and a wiring capacitance of the delay clock line L1 and the tristate buffer.

The transistors $6a$, $6a$ and $6c$ for setting the delay clock line L1 to high level when an external clock CLA is low level are provided on the delay clock line L1. Similarly, the transistors $7a$, $7b$ and $7c$ for setting the operand bus L2 to high level when the external clock CLK is low level is provided on the operand line L2.

Figure 5:
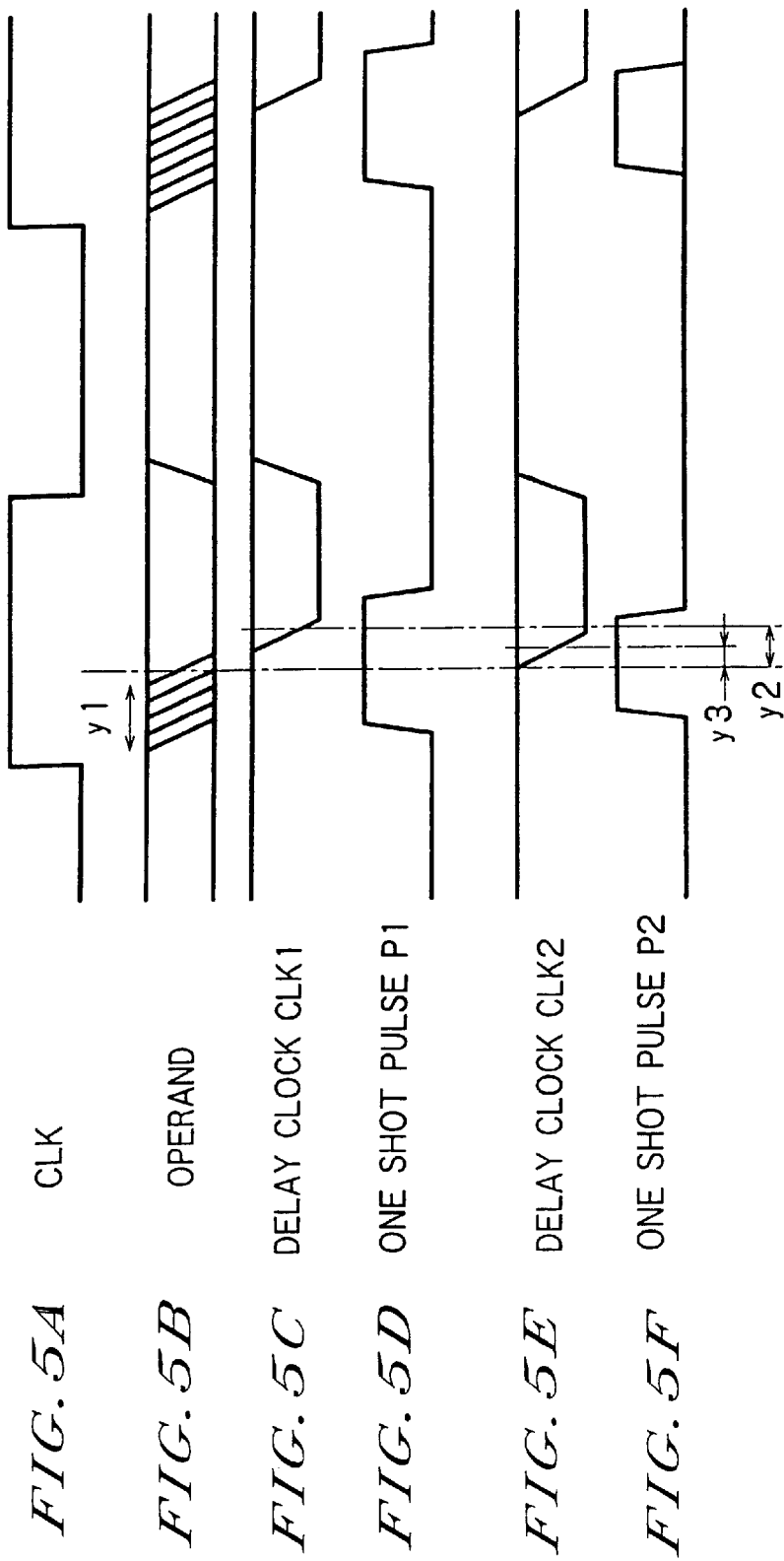
FIG. 5 is a timing diagram of a timing signal occurrence circuit of FIG. 4.

FIG. 5 is a timing chart of the timing signal occurrence circuit of FIG. 4. Hereinafter, operation of the circuit of FIG. 4 will be described with reference to the timing chart of FIG. 5.

The calculator $3d$ of FIG. 4 is constituted by precharge logic, and fetches the operand at a time when the one shot pulse outputted from the pulse generating circuit 4 changes from high level to low level. Because of this, before the one shot pulse changes from high level to low level, the operand on the operand bus L2 has be settled in advance.

FIG. 5A is a diagram showing timing of the external clock CLK inputted from outside for the timing signal occurrence circuit of FIG. 4. The delay time of the operand on the operand bus L2 fluctuates due to voltage, temperature and so on, as shown by an arrow yl of FIG. 5B. When the tristate buffer la connected to the delay clock line L1 is in an enable state, the delay clock CLK1 inputted to the calculator $3d$ becomes waveform showing in FIG. 5C. At this time, the one shot pulse P1 inputted to the calculator $3d$ becomes waveform showing in FIG. 5D.

On the other hand, when the tristate buffer $1b$ on the delay clock line L1 is in an enable state, the delay clock CLK2 inputted to the calculator $3d$ becomes waveform showing in FIG. 5e. The one shot pulse P2 inputted to the calculator $3d$ becomes waveform showing in FIG. 5f.

In FIG. 5, a margin y2 from operand settling time till down edge of the delay clock in case that the clock is outputted from the tristate buffer 1a is expressed by an arrow y2, and a margin y3 from operand settling time till down edge of the delay clock in case that the clock is outputted from the tristate buffer 1b.

The margins y2 and y3 are determined by RC delay of the delay clock line L1 and propagation delay in the pulse generating circuit 4. Because time width of the margin y3 is shorter than that of the margin y2, when the calculator 3d can correctly calculate at time width of the margin y3, it is desirable to allow the clock to output from the tristate buffer 1b by changing over the switches 5a, 5b and 5c.

Thus, the first embodiment adjusts the delay time of the delay clock by selecting arbitrarily either of a plurality of tristate buffers 1a, 1b and 1c connected to the delay clock line L1. Because of this, it is possible to generate the one shot pulse of optimum timing for carrying out calculation by the calculator 3d. Accordingly, it is possible to prevent the problem that the one shot pulse is inputted when not a few time goes by after the operand is inputted to the calculator, or that the one shot pulse is inputted before the operand is settled.

Furthermore, the first embodiment uses the dummy circuit constituted by the tristate buffers 1a, 1b and 1c provided conventionally to provide the dummy load, for generating the timing signal. Because of this, it is possible to adjust timing without adding new components and to reduce cost increase.

(Second Embodiment)

The second embodiment adjusts driving timing of the sense amplifier by providing a dummy circuit in a memory cell array.

Figure 6:
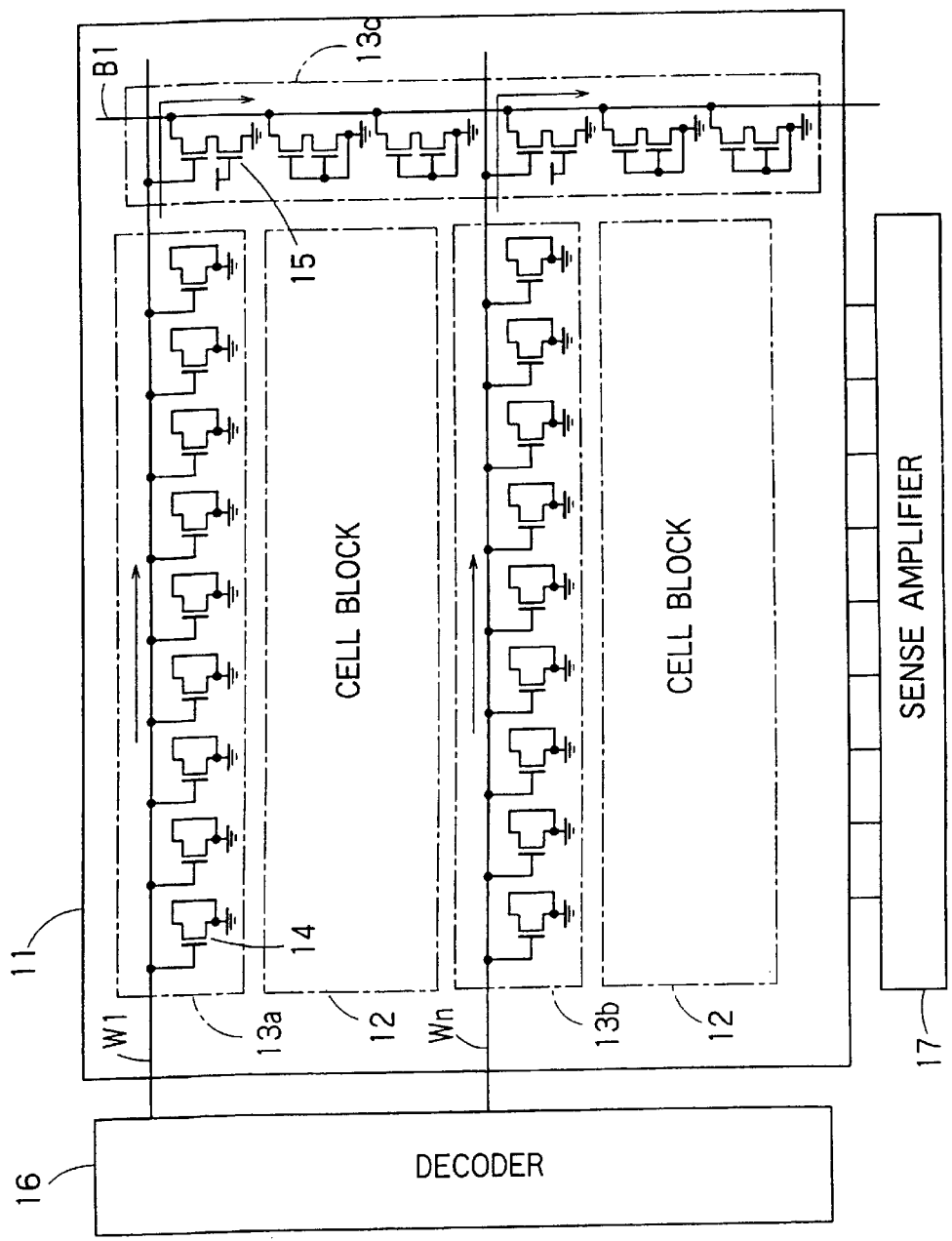
FIG. 6 is a diagram showing schematic configuration of a second embodiment of a timing signal occurrence circuit according to the present invention.

FIG. 6 is a diagram showing schematic configuration of a second embodiment of a timing signal occurrence circuit according to the present invention. The memory cell array 11 is provided with the timing signal occurrence circuit of FIG. 6. Besides, the memory cell array 11 is provided with a plurality of word lines W1–Wn and bit lines B1–Bm. A plurality of memory cells are connected to each of the word lines W1–Wn and bit lines B1–Bm.

A plurality of memory cells adjacent to each other vertically and horizontally constitute cell blocks 12. Dummy circuits 13a, 13b and 13c are provided between each cell block, respectively. These cell blocks 13a, 13b and 13c are used to set driving timing of the sense amplifier 17.

Although FIG. 6 shows an example of providing three dummy circuits 13a, 13b and 13c, the number of the dummy circuits is not especially limited.

Each of the dummy circuits 13a and 13b is consisted of a plurality of transistors 14 connected in parallel to the corresponding word line. The dummy circuit 13c is consisted of a plurality of transistors 15 connected in parallel to the corresponding bit line. The number of the transistors 14 or 15 in each of the dummy circuits is set in accordance with the number of the transistors in the cell block.

The word lines in the dummy circuits 13a and 13b are connected to a decoder 16, similarly to a normal word line. Either of the dummy circuits 13 is selected by a signal from the decoder 16. For example, the dummy circuit 13a of FIG. 6 is a path that propagation time is longest, that is, a critical path. The driving timing of the sense amplifier 17 is set so that data passing through the dummy circuit 13a is read out from the sense amplifier 17 when the word line in the dummy circuit 13a is set to high level.

The driving timing of the sense amplifier 17 is set so that data passing through the dummy circuit is read out from the sense amplifier 17 when the word line in the other dummy circuit 13b is set to high level.

Thus, the second embodiment provides a plurality of dummy circuits 13a, 13b and 13c in the memory cell array 11. The driving timing of the sense amplifier 17 is set so that data passing through each of the dummy circuits is correctly outputted from the sense amplifier 17. Therefore, data read out from any memory cell in the memory cell array 11 can be correctly outputted via the sense amplifier 17.

(Third Embodiment)

In the first embodiment, an example for manually selecting the switches 5a, 5b and 5c connected to the tristate buffers has been described. A third embodiment controls automatically selection of the switches 5a, 5b and 5c.

Figure 7:
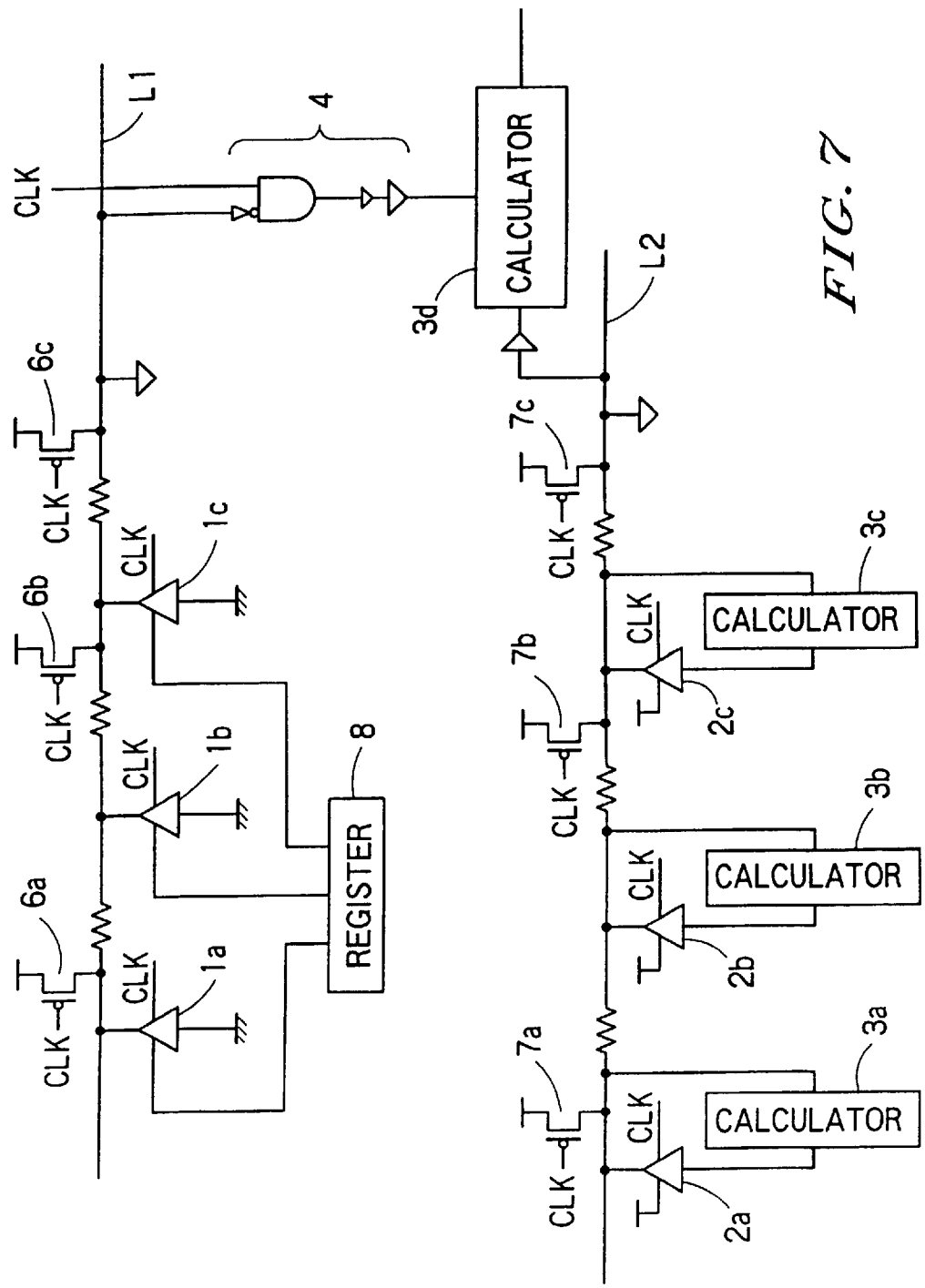
FIG. 7 is a diagram showing schematic configuration of a third embodiment of a timing signal occurrence circuit according to the present invention.

FIG. 7 is a block diagram showing schematic configuration of the third embodiment of the timing signal occurrence circuit according to the present invention. In FIG. 7, the same figure numbers are attached to constituents common to FIG. 4.

The timing signal occurrence circuit of FIG. 7 has a, register 8 for selecting either one of a plurality of tristate buffers connected to the delay clock line L1. Output of the register 8 is inputted to control terminals of the tristate buffers 1a, 1b and 1c, respectively. When output of the register 8 is in high level, the corresponding tristate buffer outputs a clock. Value set to the register 8 is controlled, for example, by a processor (unshown).

Thus, according to third embodiment, because it is possible to arbitrarily select either one of the tristate buffers by output of the register 8, the delay time of the delay clock can be switched programmably.

What is claimed is:

1. A timing signal occurrence circuit, comprising:

a plurality of signal output circuits configured to output a timing signal;

a plurality of selecting circuits configured to select whether or not to operate the corresponding signal output circuit; and a plurality of delay elements connected in series, a calculator configured to fetch operands on an operand bus and to carry out the fetched operands, in sync with a delay clock on a delay clock line;

a clock delay adjustment circuit configured to adjust delay of the delay clock on said delay clock line, and an operand delay adjustment circuit configured to adjust delay of the operands on said operand bus, wherein the respective outputs of said plurality of signal output circuits are connected to input terminals different from each other of said plurality of delay elements, said plurality of selecting circuits operates at least one of said signal output circuits, said clock delay adjustment circuit is provided with said signal output circuit configured to output said delay clock with timing different from each other, said operand delay adjustment circuit is provided with said signal output circuits configured to output the operands with timing different from each other, and each of said clock delay adjustment circuit and said operand control circuit selects either of said signal output circuit, so that said calculator fetches the operands after the operand on said operand bus is settled.

2. The timing signal occurrence circuit according to claim 1, wherein said signal output circuits are provided in accordance with a calculator being a subject for timing adjustment, and wherein said selecting circuit selects either one of said signal output circuits based on the delay time of a critical path of said calculator.

3. The timing signal occurrence circuit according to claim 1,
wherein each of said signal output circuits has a tristate buffer configured to switch whether to output a signal from an output terminal or to set the output terminal to be high impedance state, based on logic of a control terminal, and
wherein said selecting circuit switches logic of said control terminal.

4. The timing signal occurrence circuit according to claim 2, wherein said tristate buffer comprises a dummy load.

5. The timing signal occurrence circuit according to claim 1,
wherein each of said signal output circuit has a tristate buffer configured to switch whether to output a signal from an output terminal or to set the output terminal to be high impedance state,
wherein said selecting circuit switches logic of said control terminal,
wherein said delay adjustment circuit adjusts the delay time based on wiring resistor and wiring capacitance of said delay clock line and said transfer buffer, and
wherein said operand delay adjustment circuit adjusts the delay time based on the wiring resistance and the wiring capacitance of said operand bus and said tristate buffer.

6. The timing signal occurrence circuit according to claim 1, further comprising a plurality of transistors connected to said delay clock line, these transistors being turned on in order to set said delay clock line to a prescribed voltage level when said delay clock is in a prescribed logic.

7. The timing signal occurrence circuit according to claim 1, further comprising a plurality of transistors connected to said operand bus, these transistors being turned on in order to set said operand bus to a prescribed voltage level when said delay clock is in a prescribed logic.

8. The timing signal occurrence according to claim 1 further comprising a switch connected to said control terminal of said tristate buffer,
wherein said tristate buffer outputs said delay clock when said switch is in a first change-over state, and becomes high impedance state when said switch is in a second change-over state.

* * * * *